United States Patent
Kao et al.

(10) Patent No.: US 10,529,553 B2
(45) Date of Patent: *Jan. 7, 2020

(54) TREATMENT SYSTEM AND METHOD

(71) Applicant: Taiwan Semiconductor Manufacturing Company, Ltd., Hsinchu (TW)

(72) Inventors: Wan-Yi Kao, Baoshan Township (TW); Kuang-Yuan Hsu, Taichung (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/400,640

(22) Filed: May 1, 2019

(65) Prior Publication Data

US 2019/0259602 A1 Aug. 22, 2019

Related U.S. Application Data

(63) Continuation of application No. 14/989,227, filed on Jan. 6, 2016, now Pat. No. 10,312,075.
(Continued)

(51) Int. Cl.
*H01L 21/00* (2006.01)
*H01L 21/02* (2006.01)
(Continued)

(52) U.S. Cl.
CPC .... *H01L 21/02126* (2013.01); *H01L 21/0206* (2013.01); *H01L 21/0234* (2013.01);
(Continued)

(58) Field of Classification Search
CPC .......... H01L 21/02126; H01L 21/0206; H01L 21/0234; H01L 21/0273; H01L 21/3105; H01L 21/31144; H01L 29/66795
See application file for complete search history.

(56) References Cited

U.S. PATENT DOCUMENTS 6,054,398 A 4/2000 Pramanick
6,346,489 B1 2/2002 Cohen et al.
(Continued)

FOREIGN PATENT DOCUMENTS

DE 102009023379 A1 12/2010
KR 20010050283 A 6/2001
(Continued)

OTHER PUBLICATIONS

Bao et al., "Mechanistic Study of Plasma Damage and CH4 Recovery of Low k Dielectric Surface," International Interconnect Technology Conference, IEEE 2007, Jun. 4-6, 2007, 3 pages.
(Continued)

*Primary Examiner* — Richard A Booth
(74) *Attorney, Agent, or Firm* — Slater Matsil, LLP

(57) ABSTRACT

A method of descumming a dielectric layer is provided. In an embodiment the dielectric layer is deposited over a substrate, and a photoresist is applied, exposed, and developed after the photoresist has been applied. Once the pattern of the photoresist is transferred to the underlying dielectric layer, a descumming process is performed, wherein the descumming process utilizes a mixture of a carbon-containing precursor, a descumming precursor, and a carrier gas. The mixture is ignited into a treatment plasma, and the treatment plasma is applied to the dielectric layer in order to descum the dielectric layer.

20 Claims, 9 Drawing Sheets

Related U.S. Application Data

(60) Provisional application No. 62/234,958, filed on Sep. 30, 2015.

(51) Int. Cl.
*H01L 21/3105* (2006.01)
*H01L 21/311* (2006.01)
*H01L 29/66* (2006.01)
*H01L 21/027* (2006.01)

(52) U.S. Cl.
CPC ...... *H01L 21/0273* (2013.01); *H01L 21/3105* (2013.01); *H01L 21/31144* (2013.01); *H01L 29/66795* (2013.01)

(56) References Cited

U.S. PATENT DOCUMENTS

| | | |
|---|---|---|
| 6,372,661 B1 | 4/2002 | Lin et al. |
| 7,169,440 B2 | 1/2007 | Balasubramaniam et al. |
| 7,279,427 B2 | 10/2007 | Nishino et al. |
| 7,981,699 B2 | 7/2011 | Sirard et al. |
| 8,399,358 B2 | 3/2013 | Fischer et al. |
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,054,110 B2 | 6/2015 | Liou et al. |
| 10,312,075 B2 * | 6/2019 | Kao ............... H01L 21/0206 |
| 2007/0020952 A1 | 1/2007 | Lin et al. |
| 2007/0032087 A1 | 2/2007 | Nishino et al. |
| 2008/0237183 A1 | 10/2008 | Hsieh et al. |
| 2008/0254600 A1 | 10/2008 | Liu et al. |
| 2009/0211596 A1 | 8/2009 | Yun et al. |
| 2014/0273516 A1 | 9/2014 | Xia et al. |
| 2014/0282326 A1 | 9/2014 | Chen et al. |
| 2017/0092487 A1 | 3/2017 | Kao et al. |

FOREIGN PATENT DOCUMENTS

| | | |
|---|---|---|
| KR | 20080034001 A | 4/2008 |
| KR | 20120099220 A | 9/2012 |

OTHER PUBLICATIONS

Shamiryan et al., "Comparative study of SioCH low-k films with varied porosity interacting with etching and cleaning plasma," Journal of Vacuum Science & Technology B, vol. 20, No. 5, Sep./Oct. 2002, 7 pages.

* cited by examiner

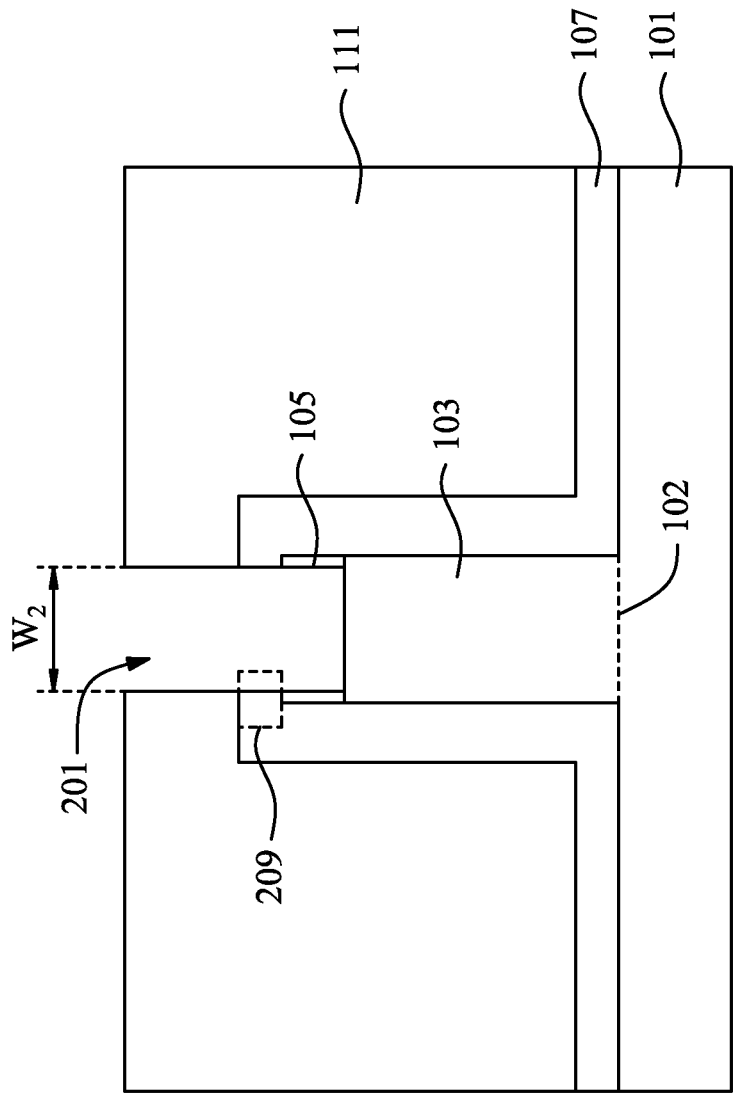
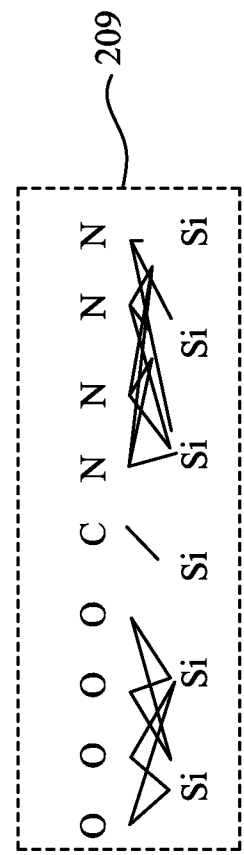
Figure 2B
Figure 2C

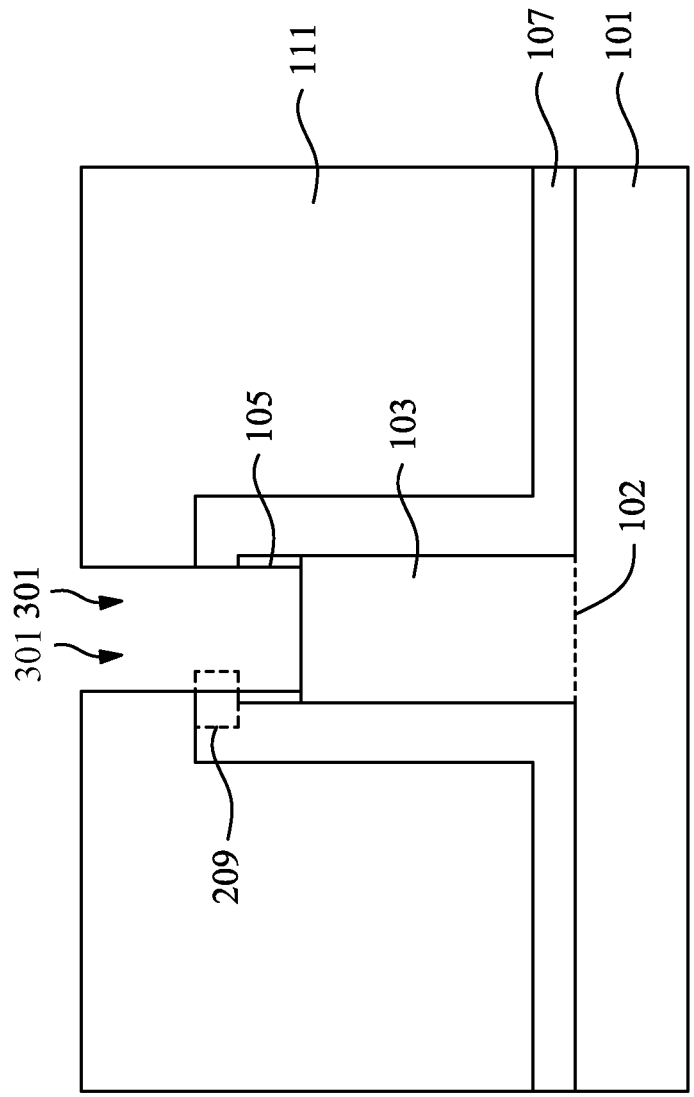
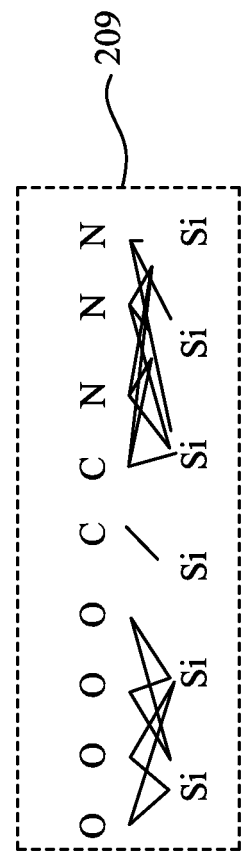
Figure 3A
Figure 3B

US 10,529,553 B2

TREATMENT SYSTEM AND METHOD

PRIORITY CLAIM AND CROSS-REFERENCE

This application is a continuation of U.S. patent application Ser. No. 14/989,227, filed Jan. 6, 2016 and entitled "Treatment System and Method," which claims the benefit of provisionally filed U.S. Patent Application Ser. No. 62/234,958, filed Sep. 30, 2015 and entitled "Treatment System and Method," which applications are hereby incorporated herein by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C illustrate a patterning of a photoresist over the dielectric layer in accordance with some embodiments.

FIGS. 3A-3D illustrate a treatment method and system in accordance with some embodiment.

DETAILED DESCRIPTION

Figure 1A:
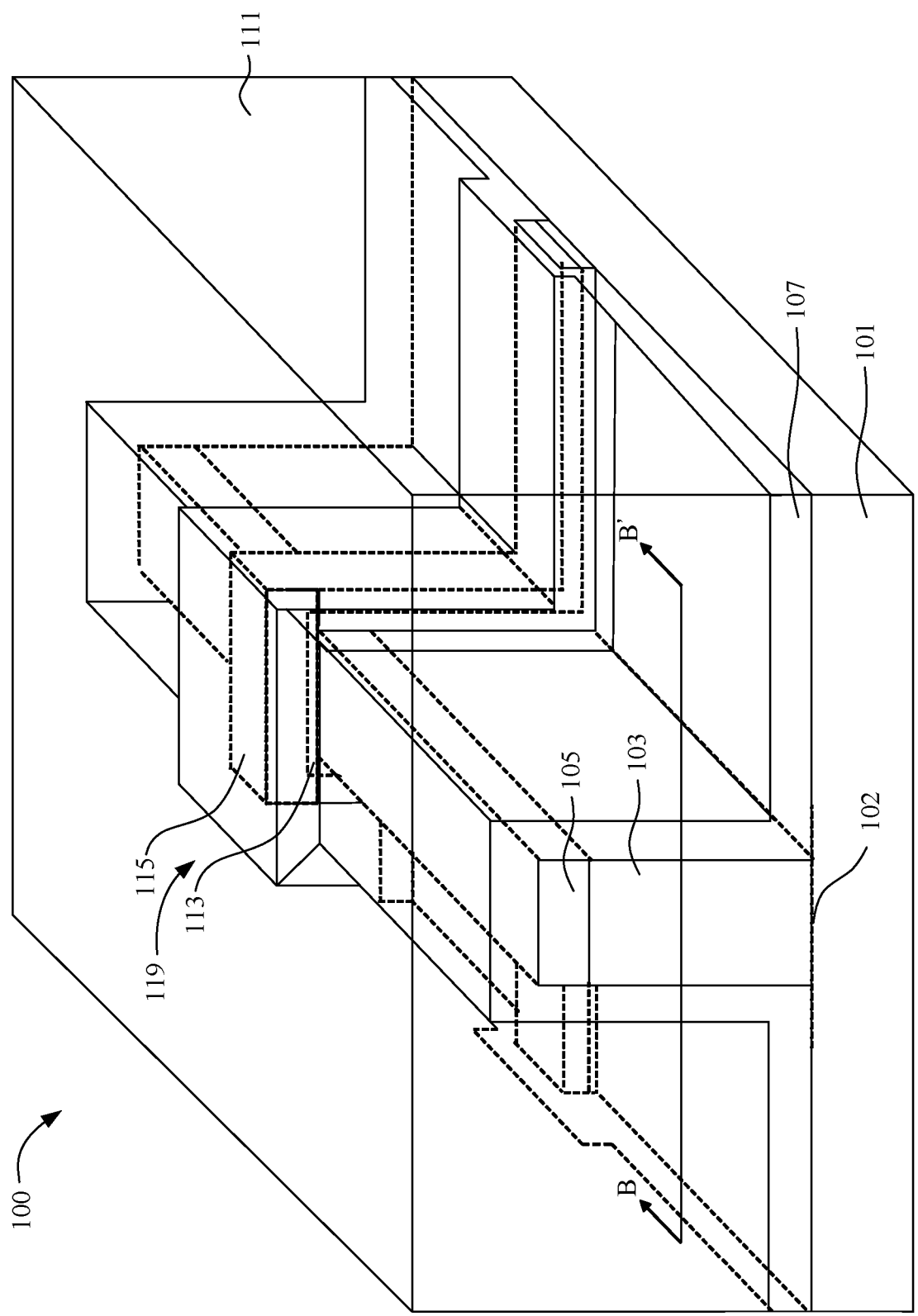
FIGS. 1A-1B illustrate a dielectric layer formed over a fin in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
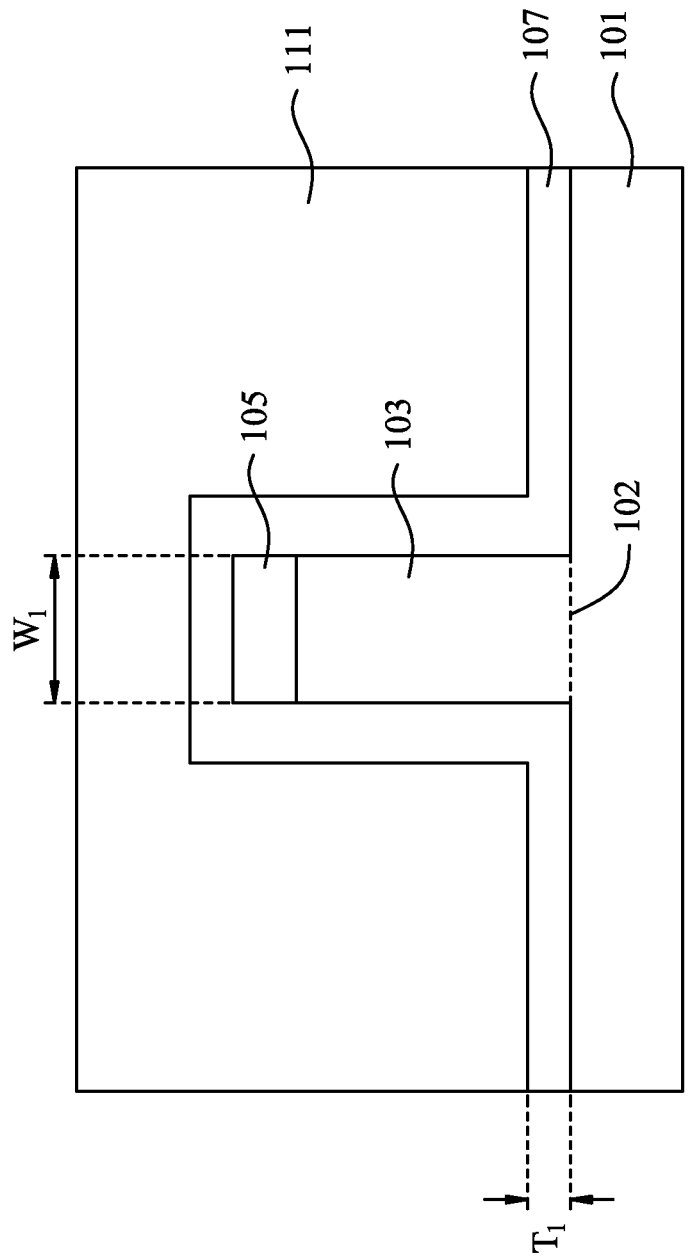

With reference now to FIGS. 1A-1B (with FIG. 1B illustrating a cross-sectional view of FIG. 1A along line B-B'), there is illustrated a semiconductor substrate 101 with a fin 103 (denoted as separate from the rest of the semiconductor substrate 101 by dashed line 102), a patterned mask 105 over the fin 103, a dielectric layer 107, and a photoresist 111. In an embodiment the semiconductor substrate 101 may comprise, for example, a III-V material (such as gallium arsenide, indium arsenide, or the like), bulk silicon, doped or undoped, germanium, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The fin 103 may be formed from the semiconductor substrate 101. In an embodiment the fin 103 may be formed from the semiconductor substrate 101 by initially forming the patterned mask 105 over the semiconductor substrate 101. The patterned mask 105 may comprise a hard mask of one or more dielectric layers. For example, the hard mask may be a layer of a silicon dioxide or a silicon nitride formed by, for example, thermal oxidation, chemical vapor deposition (CVD), or the like. Alternatively, the hard mask may be formed of other dielectric materials, such as silicon oxynitride. A multi-layer hard mask, such as layers of silicon dioxide and silicon nitride, may also be used. Furthermore, other materials, such as a metal, a metal nitride, a metal oxide, or the like may be used. For example, the hard mask may be formed of tungsten.

The patterned mask 105 is subsequently patterned using, for example, photolithography techniques. Generally, photolithography techniques involve depositing a photoresist material (not illustrated in FIG. 1A-1B) and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 105 to define the fin 103. As such, the patterned mask 105 may be formed to have a first width $W_1$ of between about 5 nm and about 100 nm, such as about 10 nm.

Once the patterned mask 105 has been formed, the fin 103 may be formed using a subtractive etching process along with the patterned mask 105. For example, exposed portions of the semiconductor substrate 101 may be etched to form the fin 103 from the semiconductor substrate 101. In an embodiment the semiconductor substrate 101 may be etched by, for example, $HBr/O_2$, $HBr/Cl_2/O_2$, or $SF_6/C_{12}$ plasma. In an embodiment the fin 103 may be patterned such that it will eventually be used for a channel in a semiconductor device such as a fin field effect transistor (FinFET).

However, as one of ordinary skill in the art will recognize, the subtractive process described above to form the fin 103 is intended to be illustrative and is not intended to limit the embodiments. Rather, any suitable process, such as an epitaxial growth process using the semiconductor substrate 101 and a mask, may alternatively be utilized to form the fin 103. Any suitable process for forming the fin 103 from the semiconductor substrate 101 may alternatively be utilized, and all such processes are fully intended to be included within the scope of the embodiments.

Once the fin 103 has been formed, a gate dielectric 113, a gate electrode 115, and spacers (not separately illustrated for clarity) may be formed as a gate stack 119 over the fin 103. In an embodiment the gate dielectric 113 may be formed by thermal oxidation, chemical vapor deposition, sputtering, or any other methods known and used in the art for forming a gate dielectric. Depending on the technique of gate dielectric formation, the gate dielectric 113 thickness on the top of the fin 103 may be different from the gate dielectric thickness on the sidewall of the fin 103.

The gate dielectric 113 may comprise a material such as silicon dioxide or silicon oxynitride with a thickness ranging from about 3 angstroms to about 100 angstroms, such as about 10 angstroms. The gate dielectric 113 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric 113.

The gate electrode 115 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 115 may be deposited by chemical vapor deposition (CVD), sputter deposition, or other techniques known and used in the art for depositing conductive materials. The thickness of the gate electrode 115 may be in the range of about 200 angstroms to about 4,000 angstroms. Ions may or may not be introduced into the gate electrode 115 at this point. Ions may be introduced, for example, by ion implantation techniques.

Once formed, the gate dielectric 113 and the gate electrode 115 may be patterned to form the gate stack 119 over the fin 103. The gate stack 119 defines multiple channel regions located within the fin 103 underneath the gate dielectric 113. The gate stack 119 may be formed by depositing and patterning a gate mask (not shown) on the gate electrode 115 using, for example, deposition and photolithography techniques known in the art. The gate mask may incorporate commonly used masking materials, such as (but not limited to) photoresist material, silicon oxide, silicon oxynitride, and/or silicon nitride. The gate electrode 115 and the gate dielectric 113 may be etched using a dry etching process to form the patterned gate stack 119.

Once the gate stack 119 has been patterned, first spacers (not separately illustrated for clarity) may be formed. The first spacers may be formed on opposing sides of the gate stack 119. The first spacers are typically formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The first spacers may then be patterned, such as by one or more etches to remove the spacer layer from the horizontal surfaces of the structure.

Once the gate stack 119 has been formed, the dielectric layer 107 is formed over the fin 103, the patterned mask 105 and the gate stack 119. In an embodiment the dielectric layer 107 is a low-k dielectric material such as SiOCN, SiOC, SiCN, or SiN, and may be formed through a process such as atomic layer deposition, chemical vapor deposition, physical vapor deposition, spin-on, combinations of these, or the like, although any suitable process may be utilized. The dielectric layer 107 may be formed to a first thickness $T_1$ of between about 20 Å and about 100 Å, such as about 50 Å.

Once the dielectric layer 107 has been formed, the dielectric layer 107 may be patterned. In an embodiment the patterning of the dielectric layer 107 may be initiated by initially applying the photoresist 111 to the dielectric layer 107. In an embodiment the photoresist 111 includes a photoresist polymer resin along with one or more photoactive compounds (PACs) in a photoresist solvent. In an embodiment the photoresist polymer resin may comprise a hydrocarbon structure (such as a alicyclic hydrocarbon structure) that contains one or more groups that will decompose (e.g., an acid labile group) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

The group which will decompose, otherwise known as a leaving group or, in an embodiment in which the PAC is an photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

Additionally, the photoresist 111 also comprises one or more PACs. The PACs may be photoactive components such as photoacid generators, photobase generators, free-radical generators, or the like, and the PACs may be positive-acting or negative-acting. However, as one of ordinary skill in the art will recognize, any suitable PAC may alternatively be utilized, and all such PACs are fully intended to be included within the scope of the present embodiments.

The individual components of the photoresist 111 may be placed into a photoresist solvent in order to aid in the mixing and placement of the photoresist 111. To aid in the mixing and placement of the photoresist 111, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the dielectric layer 107. In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

In an embodiment the photoresist polymer resin and the PACs, along with any desired additives or other agents, are added to the photoresist solvent for application. Once added, the mixture is then mixed in order to achieve an even composition throughout the photoresist 111 in order to ensure that there are no defects caused by an uneven mixing or non-constant composition of the photoresist 111. Once mixed together, the photoresist 111 may either be stored prior to its usage or else used immediately.

Once ready, the photoresist 111 may be utilized by initially applying the photoresist 111 onto the dielectric layer 107. The photoresist 111 may be applied to the dielectric layer 107 so that the photoresist 111 coats an upper exposed surface of the dielectric layer 107, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the dielectric layer 107 of between about 10 nm and about 300 nm, such as about 150 nm.

Once the photoresist 111 has been applied to the dielectric layer 107, a pre-bake of the photoresist 111 is performed in order to cure and dry the photoresist 111 prior to exposure to finish the application of the photoresist 111. The curing and drying of the photoresist 111 removes the photoresist solvent component while leaving behind the photoresist polymer resin and the PACs. In an embodiment the pre-bake may be performed at a temperature suitable to evaporate the photoresist solvent, such as between about 40° C. and 150° C., although the precise temperature depends upon the materials chosen for the photoresist 111. The pre-bake is performed for a time sufficient to cure and dry the photoresist 111, such as between about 10 seconds to about 5 minutes, such as about 90 seconds.

Figure 2A:
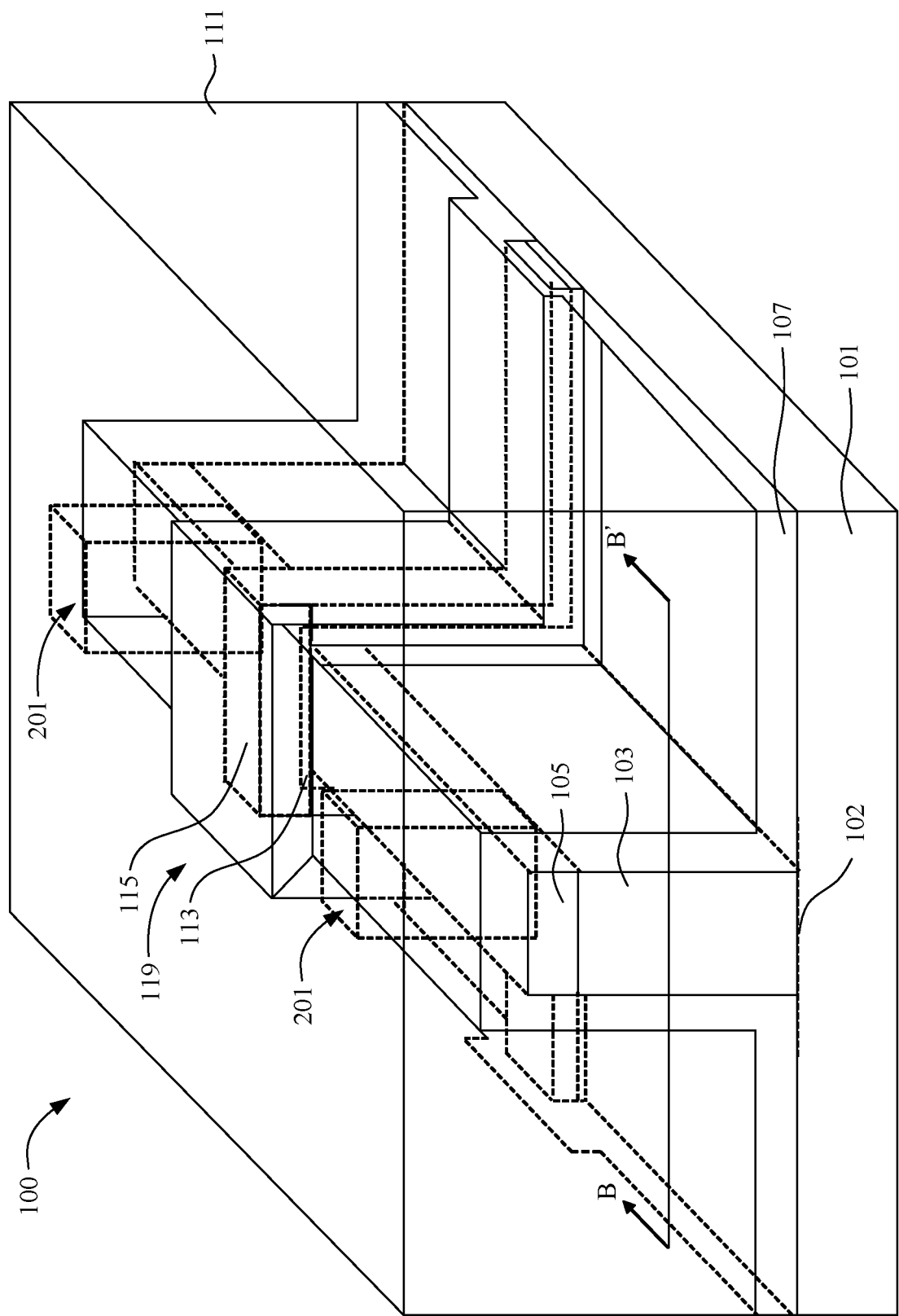

FIGS. 2A-2C illustrate that, once applied, the photoresist 111 may be exposed to form an exposed region and an unexposed region within the photoresist 111 and a development of the photoresist 111 is performed to remove either the exposed region or the unexposed region and form first opening 201. In an embodiment the exposure may be initiated by placing the semiconductor substrate 101 and the photoresist 111, once cured and dried, into a photoresist imaging device (not separately illustrated in FIGS. 2A-2C) for exposure. The photoresist imaging device may comprise a photoresist support plate, a photoresist energy source, and a patterned mask between the photoresist support plate and the photoresist energy source.

In an embodiment the photoresist energy source supplies photoresist energy such as light to the photoresist 111 in order to induce a reaction of the PACs, which in turn reacts with the photoresist polymer resin to chemically alter those portions of the photoresist 111 to which the photoresist energy impinges. In an embodiment the photoresist energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of photoresist energy, such as mercury vapor lamps, xenon lamps, carbon arc lamps or the like, may alternatively be utilized.

The patterned mask is located between the photoresist energy source and the photoresist 111 in order to block portions of the photoresist energy to form a patterned energy prior to the photoresist energy actually impinging upon the photoresist 111. In an embodiment the patterned mask may comprise a series of layers (e.g., substrate, absorbance layers, anti-reflective coating layers, shielding layers, etc.) to reflect, absorb, or otherwise block portions of the photoresist energy from reaching those portions of the photoresist 111 which are not desired to be illuminated. The desired pattern may be formed in the patterned mask by forming openings through the patterned mask in the desired shape of illumination.

In an embodiment the semiconductor device 100 with the photoresist 111 is placed on the photoresist support plate. Once the pattern has been aligned to the semiconductor device 100, the photoresist energy source generates the desired photoresist energy (e.g., light) which passes through the patterned mask on its way to the photoresist 111. The patterned energy impinging upon portions of the photoresist 111 induces a reaction of the PACs within the photoresist 111. The chemical reaction products of the PACs' absorption of the patterned energy (e.g., acids/bases/free radicals) then reacts with the photoresist polymer resin, chemically altering the photoresist 111 in those portions that were illuminated through the patterned mask.

Once the photoresist 111 has been exposed, the photoresist 111 may be developed in order to separate the exposed region from the unexposed region and form first opening 201 within the photoresist 111. After the photoresist 111 has been exposed and a post-exposure baking has occurred, the photoresist 111 may be developed using either a positive tone developer or a negative tone developer, depending upon the desired pattern for the photoresist 111. In an embodiment in which the exposed region of the photoresist 111 is desired to be removed to form a positive tone, a positive tone developer such as a basic aqueous solution may be utilized to remove those portions of the photoresist 111 which were exposed to the patterned energy and which have had their solubility modified and changed through the chemical reactions. If a negative tone development is desired, an organic solvent or critical fluid may be utilized to remove those portions of the photoresist 111 which were not exposed to the energy and, as such, retain their original solubility.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 111 that has a different property (e.g., solubility) than another portion of the photoresist 111, may alternatively be utilized, and all such developers are fully intended to be included within the scope of the embodiments.

FIG. 2B additionally illustrates that, once the photoresist 111 has been developed, the first opening 201 formed within the photoresist 111 by the exposure and development process described above is transferred into the underlying dielectric layer 107 and the patterned mask 105. In an embodiment an etch process such as a reactive ion etch may be used along with the photoresist 111 as a mask in order to remove portions of the dielectric layer 107 and the patterned mask 105 that are exposed by the photoresist 111. However, any suitable processing may alternatively be utilized. In an embodiment the first opening 201 will have a second width $W_2$ of between about 10 nm and about 100 nm, such as about 20 nm.

FIG. 2C illustrates a close-up view of the surface of the dielectric layer 107 facing the first opening 201 within the dashed line 209 in FIG. 2B. In an embodiment in which the dielectric layer 107 comprises SiOCN, the surface of the dielectric layer 107 will have multiple terminal groups, including oxygen bonded to the underlying silicon, carbon bonded to the underlying silicon, and nitrogen bonded to the underlying silicon. For example, the dielectric layer 107 may have an as-deposited concentration of silicon of about 33.4%-atomic, an as-deposited concentration of carbon of about 4.4%-atomic, an as-deposited concentration of oxygen of about 42.6%-atomic, and an as-deposited concentration of nitrogen of about 19.5%-atomic. However, any suitable concentration may be utilized.

FIGS. 3A-3D illustrate a descum or treatment process (represented in FIG. 3A by the wavy arrows labeled 301) that may be used to remove scum or other residue that may be left behind after the development of the photoresist 111 and the transfer of the pattern into the dielectric layer 107. In an embodiment the treatment process 301 may be performed using a mixture of a first treatment precursor, a recovery precursor, and a carrier gas. In an embodiment the first treatment precursor is used to react and remove left over residue, and may be an oxygenating precursor such as oxygen ($O_2$), although any other suitable oxygenating precursor, such as ozone or $O_2/H_2$, or any other first treatment precursors, such as $H_2$, $H_2/N_2$, or $NH_3$, may also be utilized.

However, the first treatment precursor will, by itself, damage the surface of the dielectric layer 107. For example, in an embodiment in which the dielectric layer 107 is SiOCN which has a surface that comprises silicon-oxygen bonds, silicon-carbon bonds, and silicon-nitrogen bonds, the first treatment precursor will also break the silicon-carbon bonds and silicon-nitrogen bonds. Additionally, with only the plasma of the first treatment precursor present, the atoms from the plasma of the first treatment precursor (e.g., oxygen atoms) will replace carbon atoms and nitrogen atoms along the surface with additional oxygen atoms.

In an effort to mitigate this problem, the recovery precursor is utilized along with the first treatment precursor in order to recover at least some of the bonds broken by the first treatment precursor. In an embodiment the recovery precursor is a precursor that can be used to recover carbon bonds that are damaged during the exposure of the dielectric layer 107 to the plasma of the first treatment precursor (e.g., $O_2$). In an embodiment the recovery precursor may be a carbon-containing precursor such as methane, carbon dioxide, ethane, propane, combinations of these, or the like. However, any suitable carbon-containing precursor may be used.

Additionally, a carrier gas may be utilized to control and dilute the recovery precursor and the first treatment precursor and to help with the ignition of the first treatment precursor and the recovery precursor by lowering the voltage used to ignite the first treatment precursor and the recovery precursor into a plasma (described further below). In an embodiment the carrier gas may be a non-reactive gas such as argon, helium, or krypton, although any suitable carrier gas may be used.

Figure 3C:
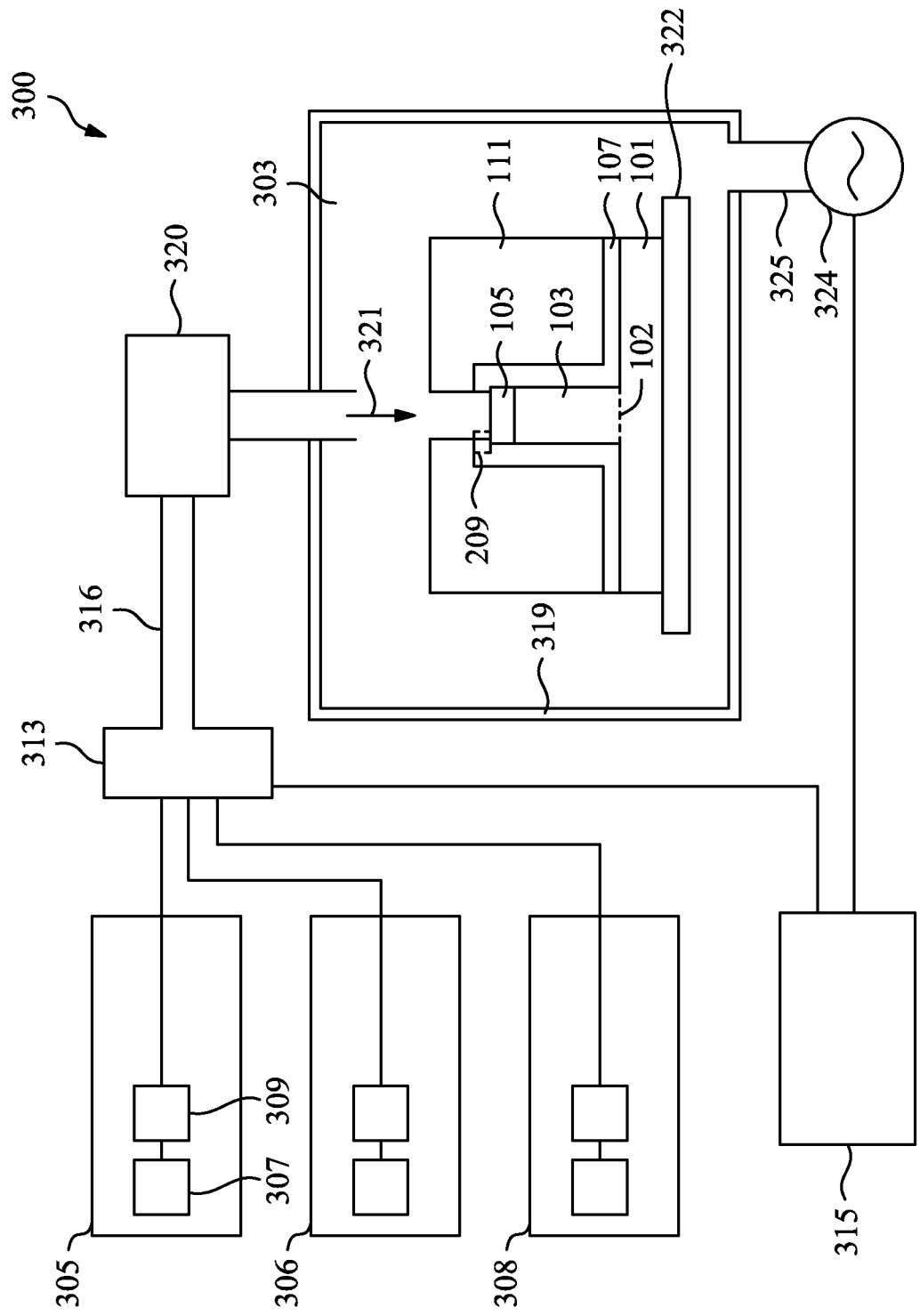

FIG. 3C illustrates that, to initiate the treatment process 301, the dielectric layer 107 (and the semiconductor substrate 101) may be placed within a treatment system 300 that may, for example, use a remote plasma system as part of the treatment process 301. In an embodiment the treatment system 300 may receive the first treatment precursor from a first precursor delivery system 305, the recovery precursor from a second precursor delivery system 306, and the carrier gas from a third precursor delivery system 308.

The first precursor delivery system 305, the second precursor delivery system 306, and the third precursor delivery system 308 may work in conjunction with one another to supply the various different precursor materials to the treatment chamber 303 through, e.g., the precursor gas controller 313. However, the first precursor delivery system 305, the second precursor delivery system 306, and the third precursor delivery system 308 may have physical components that are similar with each other. For example, the first precursor delivery system 305, the second precursor delivery system 306, and the third precursor delivery system 308 may each include a gas supply 307 and a flow controller 309 (labeled in FIG. 3C with regards to the first precursor delivery system 305 but not labeled for clarity with respect to the second precursor delivery system 306 or the third precursor delivery system 308).

In an embodiment in which the first treatment precursor is stored in a gaseous state, the gas supply 307 may supply the first treatment precursor to the treatment chamber 303. The gas supply 307 may be a vessel, such as a gas storage tank, that is located either locally to the treatment chamber 303 or else may be located remotely from the treatment chamber 303. Alternatively, the gas supply 307 may be a facility that independently prepares and delivers the first treatment precursor to the flow controller 309. Any suitable source for the first treatment precursor may be utilized as the gas supply 307, and all such sources are fully intended to be included within the scope of the embodiments.

The gas supply 307 may supply the desired first treatment precursor to the flow controller 309. The flow controller 309 may be utilized to control the flow of the first treatment precursor to the precursor gas controller 313 and, eventually, to the treatment chamber 303, thereby also helping to control the pressure within the treatment chamber 303. The flow controller 309 may be, e.g., a proportional valve, a modulating valve, a needle valve, a pressure regulator, a mass flow controller, combinations of these, or the like. However, any suitable method for controlling and regulating the flow of the first treatment precursor to the precursor gas controller 313 may be utilized, and all such components and methods are fully intended to be included within the scope of the embodiments.

However, as one of ordinary skill in the art will recognize, while the first precursor delivery system 305, the second precursor delivery system 306, and the third precursor delivery system 308 have been described herein as having identical components, this is merely an illustrative example and is not intended to limit the embodiments in any fashion. Any type of suitable precursor delivery system, with any type and number of individual components identical to or different from any of the other precursor delivery systems within the treatment system 300, may alternatively be utilized. All such precursor deposition systems are fully intended to be included within the scope of the embodiments.

Additionally, in an embodiment in which the first treatment precursor is stored in a solid or liquid state, the gas supply 307 may store a carrier gas and the carrier gas may be introduced into a precursor canister (not separately illustrated), which stores the first treatment precursor in the solid or liquid state. The carrier gas is then used to push and carry the first treatment precursor as it either evaporates or sublimates into a gaseous section of the precursor canister before being sent to the precursor gas controller 313. Any suitable method and combination of units may be utilized to provide the first treatment precursor, the recovery precursor, and the carrier gas, and all such combination of units are fully intended to be included within the scope of the embodiments.

The first precursor delivery system 305, the second precursor delivery system 306, and the third precursor delivery system 308 may supply their individual precursor materials into the precursor gas controller 313 which may connect and isolate the first precursor delivery system 305, the second precursor delivery system 306, and the third precursor delivery system 308 to and from the treatment chamber 303 in order to deliver the desired precursor materials to the treatment chamber 303 at the desired ratios (discussed further below). The precursor gas controller 313 may include such devices as valves, flow meters, sensors, and the like to control the delivery rates of each of the precursors (e.g., the first treatment precursor, the recovery precursor, and the carrier gas), and may be controlled by instructions received from the control unit 315.

The precursor gas controller 313, upon receiving instructions from the control unit 315, may open and close valves so as to connect the first precursor delivery system 305, the second precursor delivery system 306, and the third precursor delivery system 308 to the treatment chamber 303 and direct a desired treatment mixture through a manifold 316 to a plasma block 320. In an embodiment the plasma block 320 has an inlet port that receives the treatment mixture from the manifold 316 and an outlet port that is coupled to deliver a first treatment plasma 321 (converted from the first treatment precursor, the recovery precursor, and the carrier gas) to the treatment chamber 303. In an embodiment in which the plasma block 320 is a magnetic plasma generator, the first treatment precursor, the recovery precursor, and the carrier gas enter the plasma block 320 and pass between a magnetic core that surrounds a portion of the plasma block 320. The magnetic core is utilized to induce the formation of the first treatment plasma 321 from the first treatment precursor, the recovery precursor, and the carrier gas that enters the plasma block 320.

The magnetic core may be situated around a portion of the flow path through the plasma block 320 from the inlet port to the outlet port. In an embodiment the magnetic core is one portion of a transformer, with a primary coil forming another portion of the transformer. In an embodiment the primary coil may have a winding of between about 100 and about 1000 such as about 600. To generate the desired first treatment plasma 321 from the first treatment precursor, the recovery precursor, and the carrier gas within the plasma block 320, a short, high-voltage pulse of electricity controlled, e.g., by the control unit 315 may be applied to the primary coil. The high-voltage pulse of electricity in the primary coil is transformed to a pulse of energy into the magnetic core, which induces the formation of the first treatment plasma 321 from the first treatment precursor, the recovery precursor, and the carrier gas within the plasma block 320. In an embodiment the high-voltage pulse may be between about 10 kHz and about 30 MHz such as about 13.56 MHz. while the temperature is between about 50° C. and about 200° C. and with a pressure of between about 1 torr and about 20 torr.

However, while igniting the first treatment precursor, the recovery precursor, and the carrier gas with a magnetic coil is described as an embodiment that may be used with the embodiments, the embodiments are not so limited. Rather, any suitable method or structures may be used to ignite the first treatment precursor, the recovery precursor, and the carrier gas to form the first treatment plasma 321. For example, in alternative embodiments a high voltage pulse may be applied to an electrode (not illustrated) coupled to the plasma block 320, or the first treatment precursor, the recovery precursor, and the carrier gas may be exposed to a ultraviolet radiation that may be used to ignite the first treatment precursor, the recovery precursor, and the carrier gas and form the first treatment plasma 321. Any suitable method of igniting the first treatment precursor, the recovery precursor, and the carrier gas and any other suitable plasma inducing device are fully intended to be included within the scope of the embodiments.

Once the first treatment plasma 321 has been generated, the first treatment plasma 321 may be directed into the treatment chamber 303. The treatment chamber 303 may receive the first treatment plasma 321 and expose the first treatment plasma 321 to the dielectric layer 107, and the treatment chamber 303 may be any desired shape that may be suitable for dispersing the first treatment plasma 321 and contacting the first treatment plasma 321 with the dielectric layer 107. In the embodiment illustrated in FIG. 3C, the treatment chamber 303 has a cylindrical sidewall and a bottom. However, the treatment chamber 303 is not limited to a cylindrical shape, and any other suitable shape, such as a hollow square tube, an octagonal shape, or the like, may alternatively be utilized. Furthermore, the treatment chamber 303 may be surrounded by a housing 319 made of material that is inert to the various process materials. As such, while the housing 319 may be any suitable material that can withstand the chemistries and pressures involved in the deposition process, in an embodiment the housing 319 may be steel, stainless steel, nickel, aluminum, alloys of these, combinations of these, and like.

Within the treatment chamber 303 the dielectric layer 107 may be placed on a mounting platform 322 in order to position and control the semiconductor substrate 101 and the dielectric layer 107 during the treatment process 301. The treatment chamber 303 may also have an exhaust outlet 325 for exhaust gases to exit the treatment chamber 303. A vacuum pump 324 may be connected to the exhaust outlet 325 of the treatment chamber 303 in order to help evacuate the exhaust gases. The vacuum pump 324, under control of the control unit 315, may also be utilized to reduce and control the pressure within the treatment chamber 303 to a desired pressure and may also be utilized to evacuate precursor materials from the treatment chamber 303 in preparation for the introduction of the next precursor material.

Figure 3D:
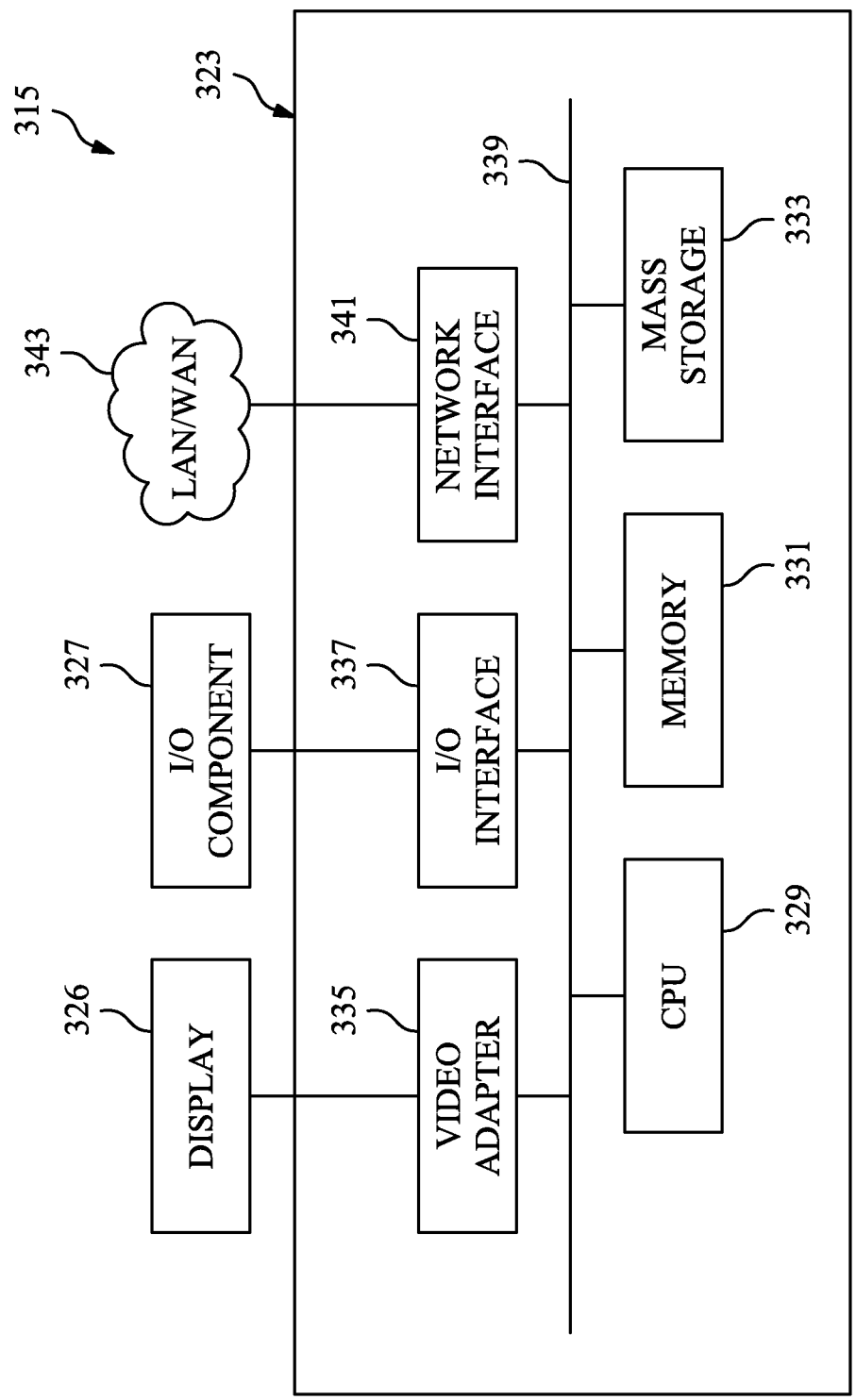

FIG. 3D illustrates an embodiment of the control unit 315 that may be utilized to control the precursor gas controller 313. The control unit 315 may be any form of computer processor that can be used in an industrial setting for controlling process machines or may alternatively be a general purpose computer platform programmed for such control. In an embodiment the control unit 315 may comprise a processing unit 323, such as a desktop computer, a workstation, a laptop computer, or a dedicated unit customized for a particular application. The control unit 315 may be equipped with a display 326 and one or more input/output components 327, such as instruction outputs, sensor inputs, a mouse, a keyboard, printer, combinations of these, or the like. The processing unit 323 may include a central processing unit (CPU) 329, memory 331, a mass storage device 333, a video adapter 335, and an I/O interface 337 connected to a bus 339.

The bus 339 may be one or more of any type of several bus architectures including a memory bus or memory controller, a peripheral bus, or video bus. The CPU 329 may comprise any type of electronic data processor, and the memory 331 may comprise any type of system memory, such as static random access memory (SRAM), dynamic random access memory (DRAM), or read-only memory (ROM). The mass storage device 333 may comprise any type of storage device configured to store data, programs, and other information and to make the data, programs, and other information accessible via the bus 339. The mass storage device 333 may comprise, for example, one or more of a hard disk drive, a magnetic disk drive, or an optical disk drive.

The video adapter 335 and the I/O interface 337 provide interfaces to couple external input and output devices to the processing unit 323. As illustrated in FIG. 3D, examples of input and output devices include the display 326 coupled to the video adapter 335 and the I/O component 205, such as a mouse, keyboard, printer, and the like, coupled to the I/O interface 337. Other devices may be coupled to the processing unit 323, and additional or fewer interface cards may be utilized. For example, a serial interface card (not shown) may be used to provide a serial interface for a printer. The processing unit 323 also may include a network interface 341 that may be a wired link to a local area network (LAN) or a wide area network (WAN) 343 and/or a wireless link.

It should be noted that the control unit 315 may include other components. For example, the control unit 315 may include power supplies, cables, a motherboard, removable storage media, cases, and the like. These other components, although not shown in FIG. 2, are considered part of the control unit 315.

In a specific embodiment, the treatment process 301 is initiated by putting the first treatment precursor (e.g., oxygen) into the first precursor delivery system 305 or having the first treatment precursor formed by the first precursor delivery system 305. Additionally, the recovery precursor may be placed into or formed by the second precursor delivery system 306, and the carrier gas may be placed into or formed by the third precursor delivery system 308. Once the first treatment precursor, the recovery precursor, and the carrier gas have been placed into the first precursor delivery system 305, the second precursor delivery system 306, and the third precursor delivery system 308, respectively, the treatment process 301 may be initiated by the control unit 315 sending an instruction to the precursor gas controller 313 to connect the first precursor delivery system 305, the second precursor delivery system 306, and the third precursor delivery system 308 to the manifold 316 in a desired concentration. In an embodiment the precursor gas controller 313 may control the concentration such that the first treatment precursor (e.g., $O_2$) has a concentration within the manifold 316 of between about 2% and about 50%, such as about 5%. Additionally, the precursor gas controller 313 may control the concentration of the recovery precursor (e.g., $CH_4$) to be between about 2% and about 80%, such as about 15%, and control the carrier gas (e.g., Ar) to have a concentration of between about 2% and about 90%, such as about 80%.

Once the first treatment precursor, the recovery precursor, and the carrier gas have been mixed into the treatment mixture in the manifold 316, the treatment mixture may enter the plasma block 320. In the plasma block 320 the first treatment precursor, the recovery precursor, and the carrier gas within the treatment mixture will be converted into the first treatment plasma 321. Once converted, the first treatment plasma 321 is then sent into the treatment chamber 303, where the pressure may be kept between about 10 mT and about 200 mT, such as about 200 mT, and the temperature may be kept between about 15° C. and about 65° C., such as about 40° C.

Once in the treatment chamber 303, the first treatment plasma 321 will react with the terminal groups that terminate the surface of the dielectric layer 107. For example, the plasma of the first treatment precursor (e.g., an oxygen plasma) will work to descum any remaining portions of the photoresist 111 or any remaining residue from the patterning of the dielectric layer 107. However, in addition to removing the left over and undersired residue, the plasma of the first treatment precursor will also react with and break at least some of the bonds between the silicon, carbon, and nitrogen atoms along the surface of the dielectric layer 107, leaving open terminal groups where the silicon had been bonded to the carbon and the nitrogen. The breaking of these bonds, and the subsequent reactions, if not otherwise recovered or mitigated, damage the dielectric layer 107.

For example, in the embodiment discussed above (wherein the dielectric layer 107 has an as-deposited concentration of 33.4% Si, 4.4% C, 42.6% O, and 19.5% N at the surface of the dielectric layer 107), if only the plasma of the first treatment precursor (e.g., oxygen plasma) were introduced without the plasma of the recovery precursor, the concentration of the various atoms at the surface of the dielectric layer 107 will be modified by the plasma of the first treatment precursor breaking the bonds between the carbon atoms and the nitrogen atoms and then having open terminal groups for the atoms of the plasma of the first treatment precursor (e.g., atoms of oxygen) to bond with, thereby replacing atoms such as carbon and nitrogen with atoms of oxygen at the surface of the dielectric layer 107.

For example, in some embodiments in which the plasma of the first treatment precursor is used without the plasma of the recovery precursor, the concentration of carbon at the surface of the dielectric layer 107 may be reduced from 4.4% carbon to 2.2% carbon, along with an increase in oxygen from 42.6% to 57.4%. Additionally, the concentration of silicon may change from 33.4% to 30.7% along with a change in nitrogen from 19.5% to 9.7%. Such a change will result in an increase in the depth of the dielectric layer 107 that has been damaged from 5 Å deep to 21 Å deep (as measured on a control wafer), and an increase in the K value from 5.0 to 5.05. Additionally the strip rate of the photoresist strip rate is about 253 Å.

In another example in which the plasma of the first treatment precursor is used without the plasma of the recovery precursor, the plasma of the first treatment precursor may be used on a low-dielectric material of the dielectric layer 107 which has a surface concentration of 29% silicon, 13.3% carbon, 45.9% oxygen, and 11.8% nitrogen. In this example, using the plasma of the first treatment precursor without the plasma of the recovery precursor, the carbon concentration may be reduced from 13.3% carbon to 4.9% carbon, along with an increase in oxygen from 45.9% to 61.7%. Additionally, the concentration of silicon may change from 29% to 28.4% along with a change in nitrogen from 11.8% to 5%. Such a change will result in an increase in the depth of the dielectric layer 107 that has been damaged from 8 Å deep to 24 Å deep, and an increase in the K value from 4.3 to 4.5. Additionally the strip rate of the photoresist strip rate is about 253 Å.

Also, other single plasmas such as plasma CO, plasma $NH_3$, or plasma $CH_4$ by themselves, each have their own drawbacks. For instance, the use of plasma CO, plasma $NH_3$, or plasma $CH_4$, while they may lower the damage, will also have a degradation in the photoresist strip rate. For example, the use of plasma CO may result in a photoresist strip rate of 60 Å (and a damage of 14 Å), the use of plasma $NH_3$ may result in a photoresist strip rate of 20-30 Å (and a damage of 14 Å), and the use of plasma $CH_4$ may result in a photoresist strip rate of 0 Å (and a damage of 5 Å).

As such, in order to mitigate, reduce or eliminate the damage caused by the treatment process 301, the recovery precursor is added to the treatment mixture in order to recover some of the carbon bonds and prevent or mitigate the damage. For example, as illustrated in FIG. 3B, while the plasma of the first treatment precursor (e.g. plasma of oxygen) will break and remove bonds between the underlying silicon and atoms of carbon and nitrogen, the plasma of the recovery precursor (e.g., plasma of $CH_4$) will react with the now open terminal sites and replace the carbon atoms and nitrogen atoms that have been removed by the plasma of the first treatment precursor. In FIG. 3B the single carbon atom illustrated in FIG. 2C has been removed and also replaced with another carbon atom, while a nitrogen atom has been removed and replaced with a carbon atom.

For example, in the embodiment discussed above (wherein the dielectric layer 107 has an as-deposited concentration of 33.4% Si, 4.4% C, 42.6% O, and 19.5% N), when the first treatment precursor is utilized along with the recovery precursor, the carbon concentration, instead of being reduced to 2.2%, may actually be raised to 6%, while the nitrogen concentration will be reduced from 19.5% to 11%, the oxygen concentration will be increased from 42.6% to 51.2%, and the silicon concentration is reduced from 33.4% to 31.8%. Such a recovery will reduce the depth of damage from 21 Å(when only the plasma of the first treatment precursor is used) to only 8 Å (as measured on a control wafer used for research) and will reduce the depth of damage from 13 Å(when only the plasma of the first treatment precursor is used) to only 3 Å (as measured on a product wafer where critical dimensions are utilized in the formation of devices). Additionally, the recovery will have a minimal effect, if any, on the K value (staying at 5), without having a significant effect on the photoresist strip rate, which remains almost the same at 253 Å.

In another embodiment in which the recovery precursor is used along with the first treatment precursor on the embodiment in which the dielectric layer 107 is deposited with a surface having an as-deposited concentration of 29% Si, 13.3% C, 45.9% O, and 11.8% N, the carbon concentration, instead of being reduced to 4.9%, may actually be reduced to only 9.3%, while the nitrogen concentration will be reduced from 11.8% to 5.4%, the oxygen concentration will be increased from 45.9% to 55.5%, and the silicon concentration is increased from 29% to 29.8%. Such a recovery will reduce the depth of damage from 24 Å (when only the plasma of the first treatment precursor is used) to only 10 Å (when measured on a control wafer) and will reduce the depth of damage from 15 Å (when only the plasma of the first treatment precursor is used) to only 5 Å (when measured on a product wafer). Additionally, the recovery will have a minimal effect on the K value (going from 4.3 to about 4.25), without having a significant effect on the photoresist strip rate, which remains almost the same at 253 Å.

By utilizing the recovery precursor along with the first treatment precursor and the carrier gas during the treatment process 301 in order to descum the surface of the structure, the damage to the dielectric layer 107 that normally occurs from the exposure of the surface of the dielectric layer 107 to the plasma of the first treatment precursor may be mitigated by recovering at least some of the bonds broken during the treatment process 301. By recovering these bonds, the damage from the treatment process 301 may be mitigated, and the dielectric layer 107 may be formed with a smaller thickness because etching to remove the damaged portion of the dielectric layer 107 is not needed as much. As such, a smaller overall structure may be achieved.

Figure 4:
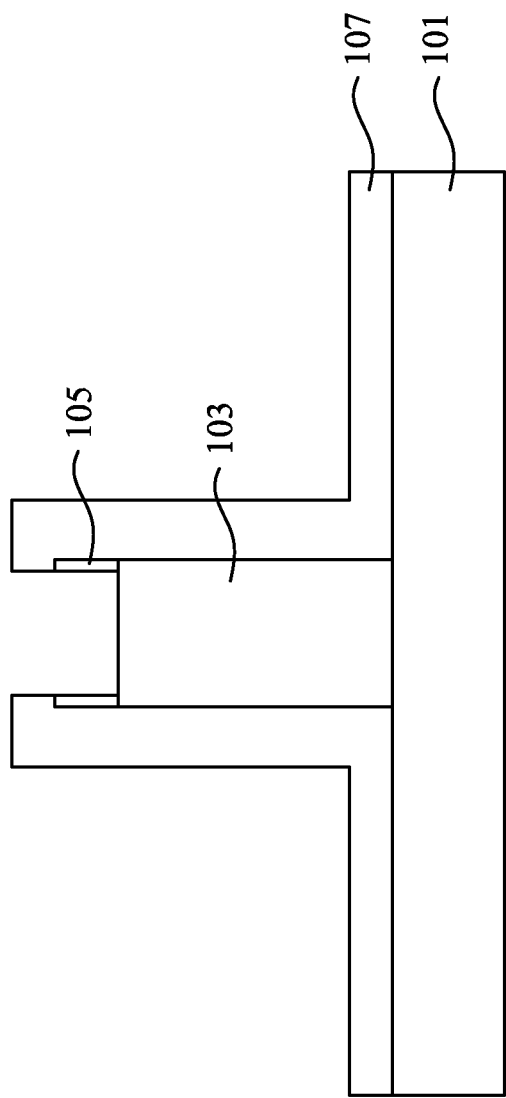
FIG. 4 illustrates a removal of the photoresist in accordance with some embodiments.

FIG. 4 illustrates a removal of the photoresist 111 from over the dielectric layer 107 after the pattern of the photoresist 111 has been transferred to the dielectric layer 107. In an embodiment the photoresist 111 may be removed using a dry etching process, such as a reactive ion etch, to etch away the photoresist 111 from the dielectric layer 107. However, any other suitable process, such as an ashing process, may be utilized.

Additionally, during the etching process to transfer the pattern into the dielectric layer 107, a portion of the dielectric layer 107 may be oxidized beneath the photoresist 111. As such, after the photoresist 111 has been removed from over the dielectric layer 107, a portion of the dielectric layer 107 may be removed in order to remove the damaged or oxidized portions of the dielectric layer 107. For example, in an embodiment in which the dielectric layer 107 has the as-deposited concentration of 33.4% Si, 4.4% C, 42.6% O, and 19.5% N (which may be oxidized up to 19 Å without any treatment) and the first treatment precursor is utilized along with the recovery precursor, the amount of oxidized dielectric layer 107 may be as low as 21 Å, while a use of the first treatment precursor by itself and without the recovery precursor may have a removal of 26 Å. As another example, in an embodiment in which the dielectric layer 107 has the as-deposited concentration of 29% Si, 13.3% C, 45.9% O, and 11.8% N (which may be oxidized up to 19 Å without any treatment) and the first treatment precursor is utilized along with the recovery precursor, the amount of oxidized dielectric layer 107 may be as low as 21 Å, while a use of the first treatment precursor by itself and without the recovery precursor may have a removal of 26 Å.

In an embodiment the removal of the damaged section of the dielectric layer 107 may be performed using a reactive ion etch process, a wet etch process, or the like. In a particular embodiment, if the reactive ion etch that removed the photoresist 111 is also suitable for the removal of the damaged portion of the dielectric layer 107, the reactive ion etch that removed the photoresist 111 may simply be continued to remove the damaged portion of the dielectric layer 107, or a separate etch process may be utilized. In another embodiment, the removal of the damaged section of the dielectric layer 107 may be performed to remove between about 10 Å and about 50 Å of the dielectric layer 107.

Once the dielectric layer 107 has been patterned, additional steps may be performed in order to complete connections to the fin 103 and the gate electrode 115 and form a fully connected FinFET device. For example, silicides, contacts, and interlayer dielectrics (not separately illustrated) may be formed in order to provide electrical connections as desired and in order to interconnect the fin 103 with other active devices and external devices in order to form a functional semiconductor die or other device.

Figure 5:
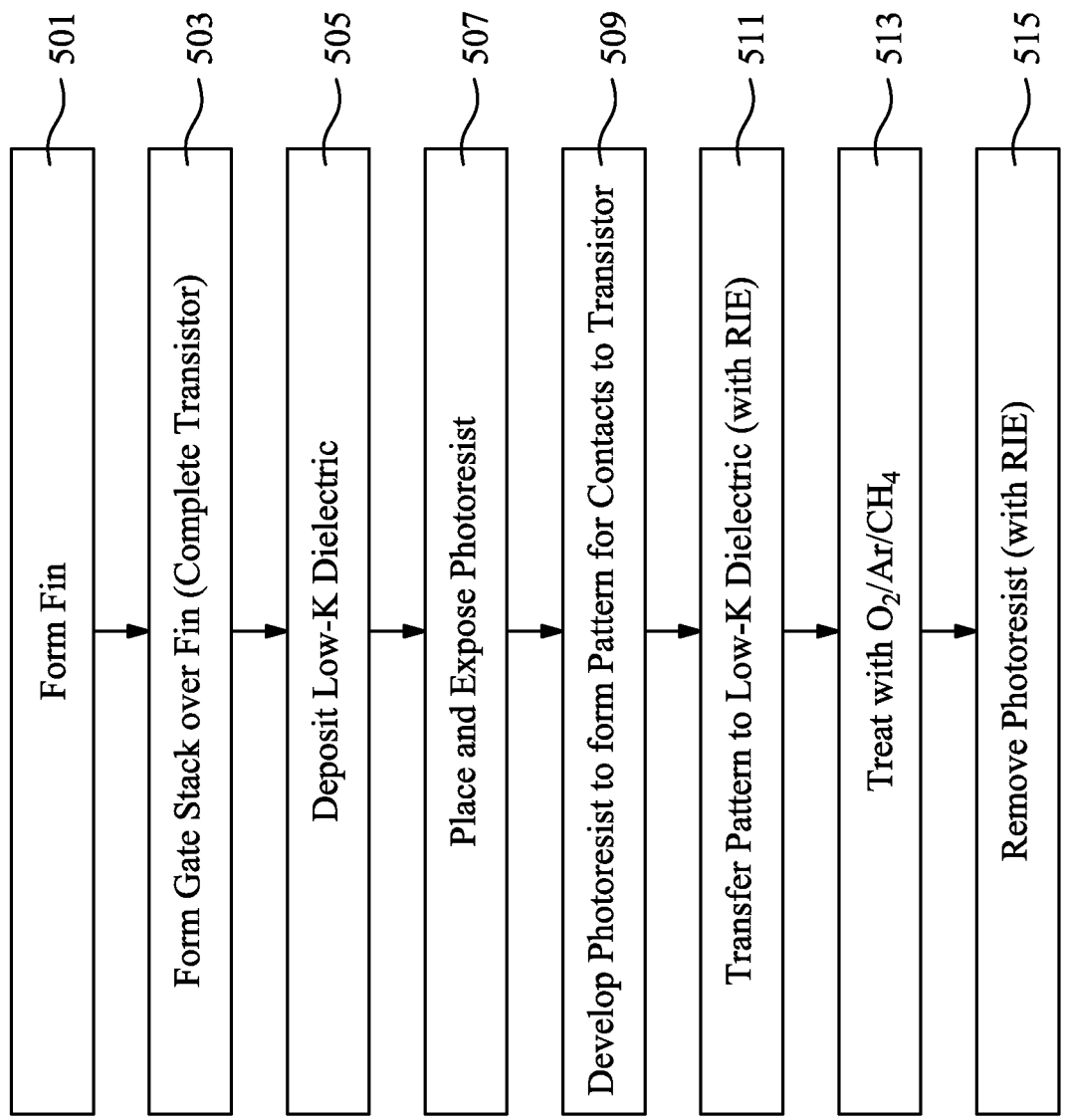
FIG. 5 illustrates a process flow of a treatment process in accordance with some embodiments.

FIG. 5 illustrates a flow chart that may be utilized with embodiments. In the embodiment illustrated in FIG. 5, a first step 501 is to form the fin, a second step 503 is to form a gate stack over the fin, a third step 505 is to form or deposit a low-k dielectric over the fin. A fourth step 507 includes a placement and patterning of the photoresist, and a fifth step 509 has a development of the photoresist to form a pattern for contacts to the transistor formed from the fin. The pattern is transferred to the dielectric layer in a sixth step 511, and the dielectric layer is treated with a first treatment precursor along with a recovery precursor and a carrier gas in a seventh step 513, and the photoresist is removed in an eighth step 515.

In accordance with an embodiment, a method of manufacturing a semiconductor device comprising applying a photoresist over a dielectric layer and exposing a first surface of the dielectric layer through the photoresist is provided. The first surface is exposed to a treatment plasma by using a treatment mixture comprising a first treatment precursor and a recovery precursor.

In accordance with another embodiment, a method of manufacturing a semiconductor device comprising depositing a low-k dielectric layer over a substrate is provided. The low-k dielectric layer is descummed, wherein the descumming the low-k dielectric layer increases a concentration of carbon along a surface of the low-k dielectric layer.

In accordance with yet another embodiment, a method of manufacturing a semiconductor device comprising depositing a dielectric layer, wherein the dielectric layer comprises first bonds between silicon atoms and oxygen atoms and second bonds between silicon atoms and carbon atoms is provided. The second bonds are broken by applying a plasma of a descumming precursor, wherein the breaking the second bonds leaves first open terminal groups, and the first open terminal groups are bonded to carbon by applying a plasma of a recovery precursor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming an opening in a dielectric layer, the opening exposing a first surface of the dielectric layer; and
    treating the first surface using a treatment mixture comprising a first treatment precursor and a recovery precursor, wherein treating the first surface comprises:
        breaking first bonds at the first surface of the dielectric layer to remove nitrogen atoms from the first surface of the dielectric layer using the first treatment precursor; and
        replacing the removed nitrogen atoms with carbon atoms from the recovery precursor.

2. The method of claim 1, wherein forming the opening comprises:
    forming a patterned mask layer over the dielectric layer; and
    patterning the dielectric layer using the patterned mask layer as a mask.

3. The method of claim 1, wherein treating the first surface further comprises:
    generating a first treatment plasma from the first treatment precursor and a second treatment plasma from the recovery precursor; and
    applying the first treatment plasma and the second treatment plasma to the first surface of the dielectric layer.

4. The method of claim 3, wherein the first treatment precursor comprises oxygen.

5. The method of claim 4, wherein the recovery precursor comprises carbon.

6. The method of claim 5, wherein the dielectric layer comprises SiOCN.

7. The method of claim 1, wherein the treatment mixture further comprises a carrier gas.

8. The method of claim 7, wherein the treatment mixture is a mixture of oxygen, methane, and argon.

9. The method of claim 8, wherein the treatment mixture comprises about 15% methane, 5% oxygen, and 80% argon.

10. The method of claim 1, wherein treating the first surface forms a treated layer of the dielectric layer proximate to the first surface, wherein the method further comprises:
    after treating the first surface, removing at least portions of the treated layer of the dielectric layer.

11. The method of claim 10, wherein removing at least portions of the treated layer comprises performing a wet etch process.

12. A method of manufacturing a semiconductor device, the method comprising:
    patterning a dielectric layer to form a first surface of the dielectric layer; and
    after patterning the dielectric layer, descumming the first surface of the dielectric layer, wherein descumming the first surface of the dielectric layer comprises:
        breaking first bonds between silicon atoms and nitrogen atoms at the first surface of the dielectric layer, wherein breaking the first bonds creates first open terminal groups at the first surface of the dielectric layer; and
        bonding carbon atoms to the first open terminal groups.

13. The method of claim 12, wherein descumming the first surface of the dielectric layer comprises descumming the first surface of the dielectric layer using a treatment precursor and a recovery precursor.

14. The method of claim 13, wherein the treatment precursor is an oxygen-containing precursor, and the recovery precursor is a carbon-containing precursor.

15. The method of claim 14, wherein breaking the first bonds comprises:
   generating a treatment plasma from the treatment precursor; and
   applying the treatment plasma to the first surface of the dielectric layer.

16. The method of claim 15, wherein bonding the carbon atoms comprises:
   generating a recovery plasma from the recovery precursor; and
   applying the recovery plasma to the first surface of the dielectric layer.

17. The method of claim 12, further comprising, after descumming the first surface of the dielectric layer, removing a portion of the dielectric layer proximate to the first surface.

18. A method of manufacturing a semiconductor device, the method comprising:
   patterning a dielectric layer, wherein the dielectric layer comprises first bonds between first silicon atoms and oxygen atoms and comprises second bonds between second silicon atoms and nitrogen atoms;
   after patterning the dielectric layer, breaking the second bonds by applying a first plasma of a descumming precursor, wherein the breaking the second bonds leaves first open terminal groups; and
   bonding the first open terminal groups to carbon by applying a second plasma of a recovery precursor.

19. The method of claim 18, wherein the first plasma and the second plasma are applied to the dielectric layer at a same time.

20. The method of claim 18, wherein the descumming precursor is an oxygen-containing precursor, and the recovery precursor is a carbon-containing precursor.

* * * * *